United States Patent
Chen et al.

(10) Patent No.: US 11,871,531 B2
(45) Date of Patent: Jan. 9, 2024

(54) COMPUTER DEVICE AND HOST MODULE THEREOF

(71) Applicant: ASUSTEK COMPUTER INC., Taipei (TW)

(72) Inventors: Yung-Hsiang Chen, Taipei (TW); Marco Da Ros, Taipei (TW); Li-Wei Hung, Taipei (TW); Li-Hsiang Chiu, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 17/688,391

(22) Filed: Mar. 7, 2022

(65) Prior Publication Data

US 2023/0049278 A1 Feb. 16, 2023

(30) Foreign Application Priority Data

Aug. 13, 2021 (TW) .................................. 110209554

(51) Int. Cl.
| | | |
|---|---|---|
| *H05K 5/03* | (2006.01) | |
| *H05K 5/02* | (2006.01) | |
| *H05K 7/20* | (2006.01) | |

(52) U.S. Cl.
CPC ............. *H05K 5/03* (2013.01); *H05K 5/0213* (2013.01); *H05K 5/0234* (2013.01); *H05K 5/0247* (2013.01); *H05K 7/20136* (2013.01)

(58) Field of Classification Search
None
See application file for complete search history.

(56) References Cited

U.S. PATENT DOCUMENTS

| | | | |
|---|---|---|---|
| 5,860,291 A | 1/1999 | Johnson et al. | |
| 6,157,423 A * | 12/2000 | Stonebraker | H05K 5/0017 345/905 |
| 6,597,569 B1 | 7/2003 | Unrein | |
| 7,159,053 B1 * | 1/2007 | Lakin | G06F 1/1601 710/72 |
| 9,696,761 B1 | 7/2017 | Truong et al. | |
| 10,126,787 B1 * | 11/2018 | Aldridge | G06F 1/16 |
| 10,303,413 B2 * | 5/2019 | Virodov | G06F 1/1632 |

(Continued)

FOREIGN PATENT DOCUMENTS

| | | |
|---|---|---|
| CN | 204761893 U | 11/2015 |
| CN | 109828640 A | 5/2019 |
| CN | 211669575 U | 10/2020 |

*Primary Examiner* — Xanthia C Relford
(74) *Attorney, Agent, or Firm* — Muncy, Geissler, Olds & Lowe, P.C.

(57) ABSTRACT

A computer device and a host module thereof are provided. The host module includes a case, a motherboard, and a power supply unit. The case includes a first side plate, a second side plate, a front panel, a rear panel, and a separation structure. The rear panel is located on an opposite side of the front panel. The first side plate, the second side plate, the front panel, and the rear panel enclose an internal space. The separation structure is located in the internal space, extends from the first side plate to the second side plate, and divides the internal space into a first part and a second part. The second part is located under the first part. The motherboard is disposed in the first part. The power supply unit is disposed in the second part, and is electrically connected to the motherboard.

11 Claims, 8 Drawing Sheets

(56) References Cited

U.S. PATENT DOCUMENTS

| | | | |
|---|---|---|---|
| 10,619,787 B1* | 4/2020 | Kho | H04N 5/655 |
| 2005/0230388 A1* | 10/2005 | Wu | G06F 1/1628 |
| | | | 220/4.02 |
| 2007/0217139 A1* | 9/2007 | Lin | G06F 1/181 |
| | | | 312/223.1 |
| 2011/0122564 A1* | 5/2011 | Hsieh | G06F 1/181 |
| | | | 361/679.33 |
| 2011/0216493 A1* | 9/2011 | Zheng | G06F 1/181 |
| | | | 361/679.21 |
| 2012/0020016 A1 | 1/2012 | Cheng | |
| 2012/0151098 A1* | 6/2012 | Sullivan | G06F 1/183 |
| | | | 710/13 |
| 2012/0281349 A1* | 11/2012 | Lai | G06F 1/181 |
| | | | 439/59 |
| 2014/0321039 A1* | 10/2014 | Quijano | F16M 11/22 |
| | | | 361/679.22 |
| 2018/0165053 A1* | 6/2018 | Kuo | G06F 3/1454 |

* cited by examiner

COMPUTER DEVICE AND HOST MODULE THEREOF

CROSS-REFERENCE TO RELATED APPLICATION

This application claims the priority benefit of Taiwan Application Serial No. 110209554, filed on Aug. 13, 2021. The entirety of the above-mentioned patent application is hereby incorporated by reference herein and made a part of the specification.

BACKGROUND OF THE INVENTION

Field of the Invention

The disclosure relates to a host module, and in particular, to a host module used as a partition structure.

Description of the Related Art

A conventional computer host often occupies a large desktop area of a desk when being disposed in an office, resulting in a limitation on a workspace of a user and impact on the appearance of the office.

On the other hand, although a conventional all-in-one computer host helps to alleviate the problem of limited desktop space, the expansion of the conventional all-in-one computer host is not easy.

BRIEF SUMMARY OF THE INVENTION

The disclosure provides a host module. The host module includes a case, a motherboard, and a power supply unit. The case includes a first side plate, a second side plate, a front panel, a rear panel, and a separation structure. The second side plate faces the first side plate. Two sides of the front panel are respectively adjacent to the first side plate and the second side plate. The rear panel is located on an opposite side of the front panel. The first side plate, the second side plate, the front panel, and the rear panel enclose an internal space.

The separation structure is located in the internal space, extends from the first side plate to the second side plate, and divides the internal space into a first part and a second part, where the second part is located under the first part. The motherboard is disposed in the first part. The power supply unit is disposed in the second part, and is electrically connected to the motherboard.

The disclosure further provides a computer device. The computer device includes a host module and an expansion module. The host module includes a case, a motherboard, and a power supply unit. The case includes a first side plate, a second side plate, a front panel, a rear panel, and a separation structure. The second side plate faces the first side plate. Two sides of the front panel are respectively adjacent to the first side plate and the second side plate. The rear panel is located on an opposite side of the front panel. The first side plate, the second side plate, the front panel, and the rear panel enclose an internal space.

The separation structure is located in the internal space, extends from the first side plate to the second side plate, and divides the internal space into a first part and a second part, where the second part is located under the first part. The motherboard is disposed in the first part. The power supply unit is disposed in the second part, and is electrically connected to the motherboard. The first side plate includes a connection port electrically connected to the motherboard. The expansion module is disposed on a side of the host module, and is electrically connected to the connection port.

A centralized configuration manner of the host module provided in the disclosure achieves thinning of modules, and the host module is further used as a partition of an office. This avoids occupying a desktop area of a desk, and also helps to improve appearance of the office. Furthermore, the expansion module provides a user with various expansion options.

DETAILED DESCRIPTION OF THE EMBODIMENTS

More detailed descriptions of the specific embodiments of the disclosure are provided below with reference to the accompanying drawings. The advantages and features of the disclosure are described more clearly according to the following description and claims. It should be noted that all of the drawings use very simplified forms and imprecise proportions, only being used for assisting in conveniently and clearly explaining the objective of the embodiments of the disclosure.

Figure 1:
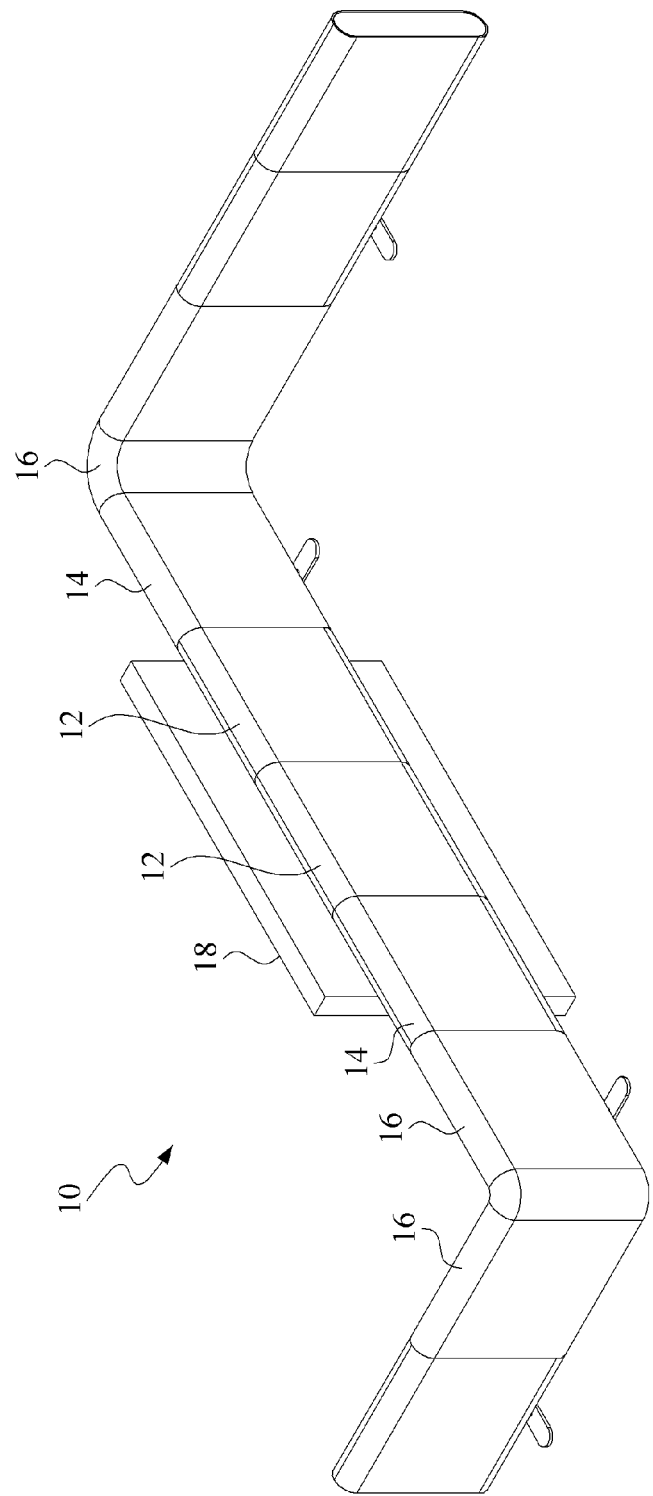
FIG. 1 is a schematic diagram of an embodiment of a computer device disposed in an office according to the disclosure.
Figure 2:
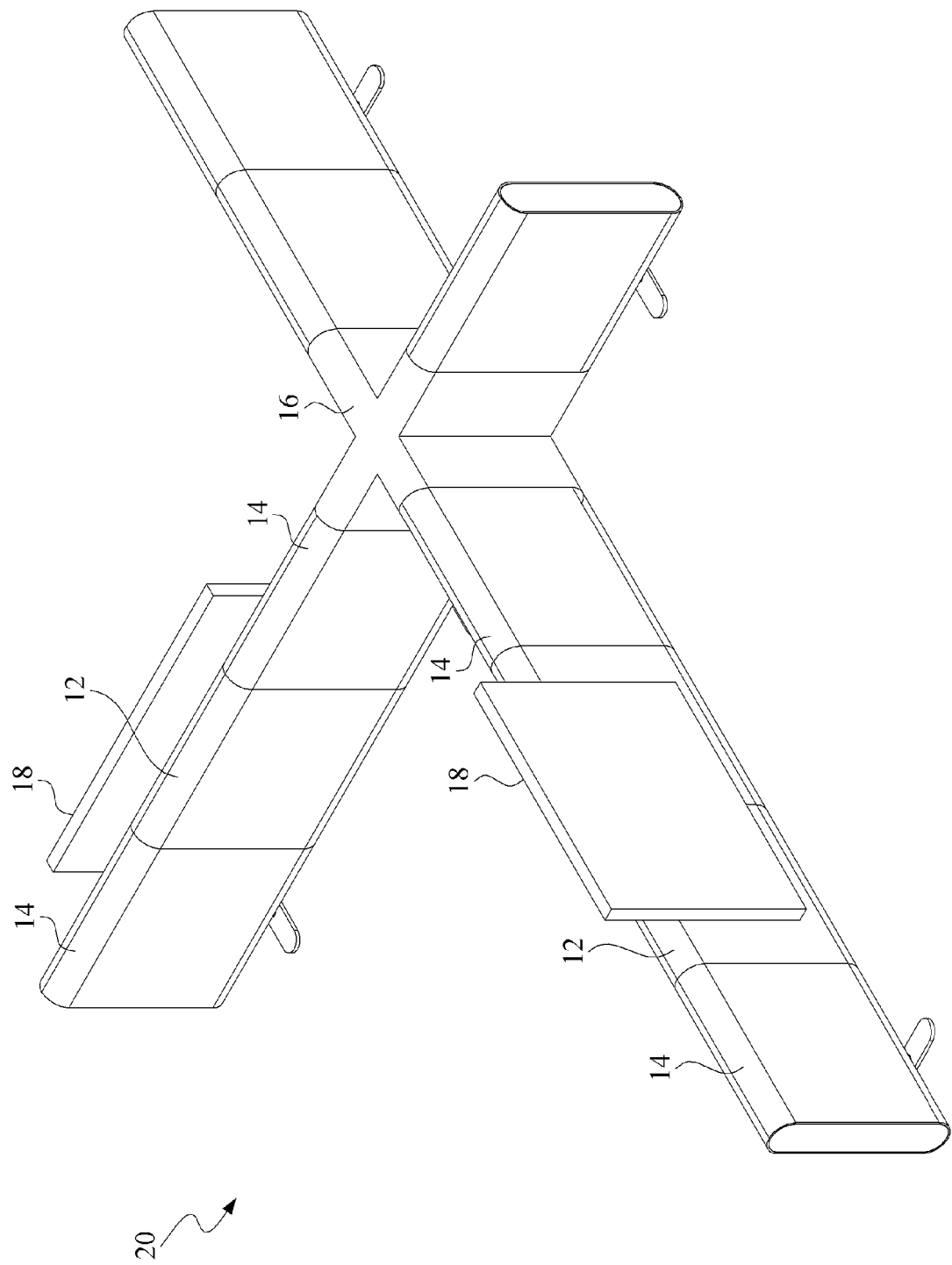
FIG. 2 is a schematic diagram of another embodiment of a computer device disposed in an office according to the disclosure.

FIG. 1 is a schematic diagram of an embodiment of a computer device 10 disposed in an office according to the disclosure. FIG. 2 is a schematic diagram of another embodiment of a computer device 20 disposed in an office according to the disclosure.

As shown in the figures, the computer device 10 or 20 of the disclosure is disposed on a desk, system functions thereof provide operational use, and a body thereof is used as a partition structure of the office. The computer device 10 or 20 includes three functional modules: a host module 12, an expansion module 14, and a partition module 16.

The host module 12 is a computer host. A side of the host module 12 is connected to the expansion module 14 or the partition module 16 to extend transversely. A screen 18 is mounted on the host module 12. In an embodiment, the expansion module 14, the partition module 16, and the host module 12 are designed with similar appearances.

The expansion module 14 is used for expanding functions of the host module 12. According to needs in actual applications, the expansion module 14 is a speaker module, a storage module, an illumination module, and the like. The partition module 16 is used as a partition.

In an embodiment, as shown in FIG. 1, the side of the host module 12 is also connected to another host module 12, and the two host modules 12 share a power supply through a power supply line (not shown in the figure), or transmit signals and share data through a connection port (not shown in the figure). Structural details related to the host module 12 are described in details in the following paragraphs.

Referring to FIG. 1 and FIG. 2, to cooperate with a partition need in a use site, the computer device 10 of the disclosure has a plurality of shapes, in an embodiment, a straight line-shaped module, an "L"-shaped module, and a cross-shaped module. The modules in different shapes are the partition module 16 or the expansion module 14.

Figure 3:
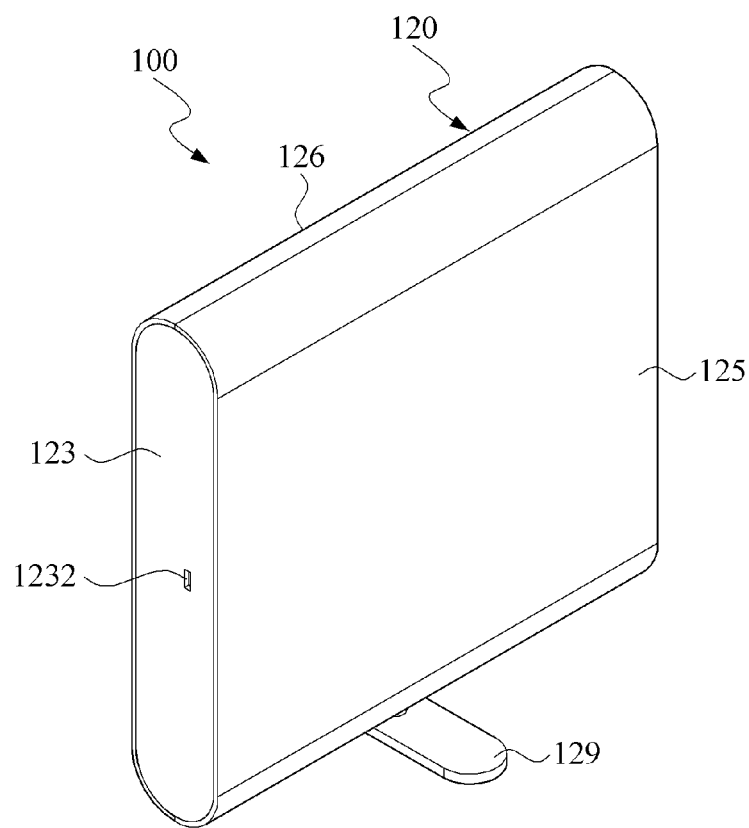
FIG. 3 is a schematic three-dimensional diagram of a first embodiment of a host module according to the disclosure.
Figure 4A:
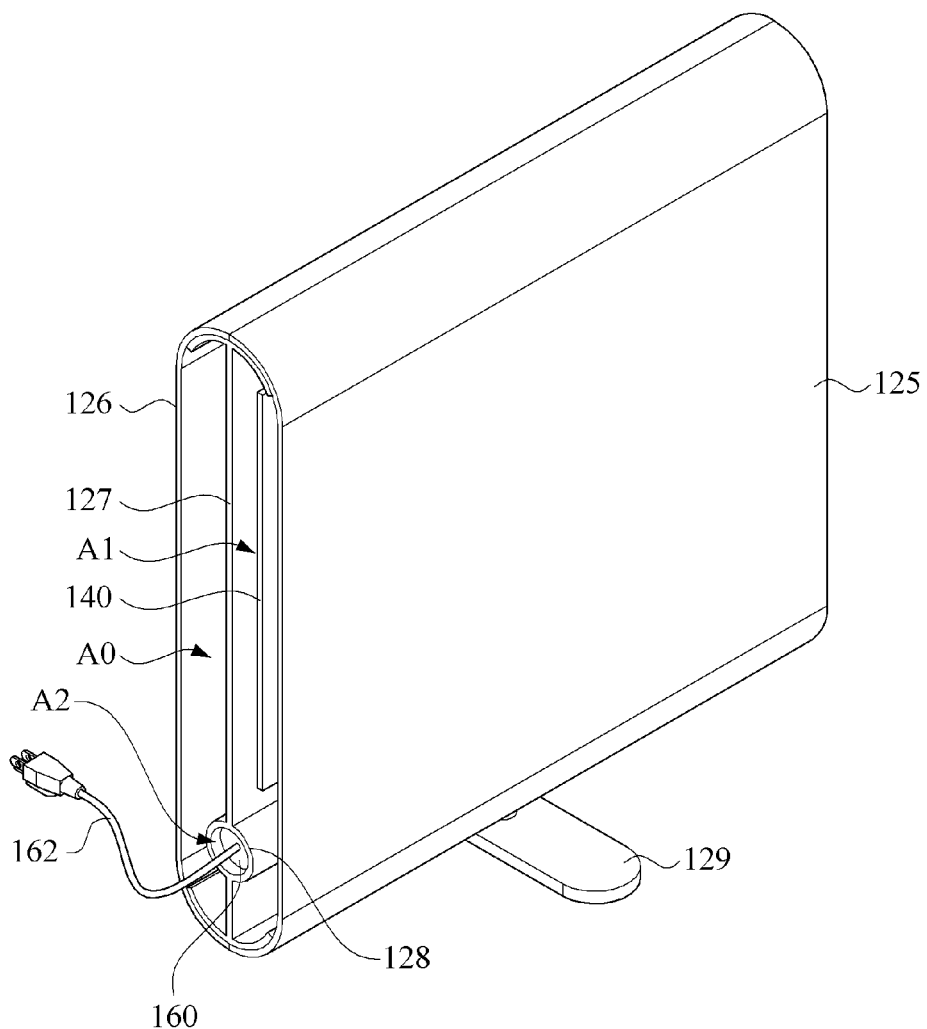
FIG. 4A is a schematic three-dimensional diagram of the host module in FIG. 3 with a first side plate removed.
Figure 4B:
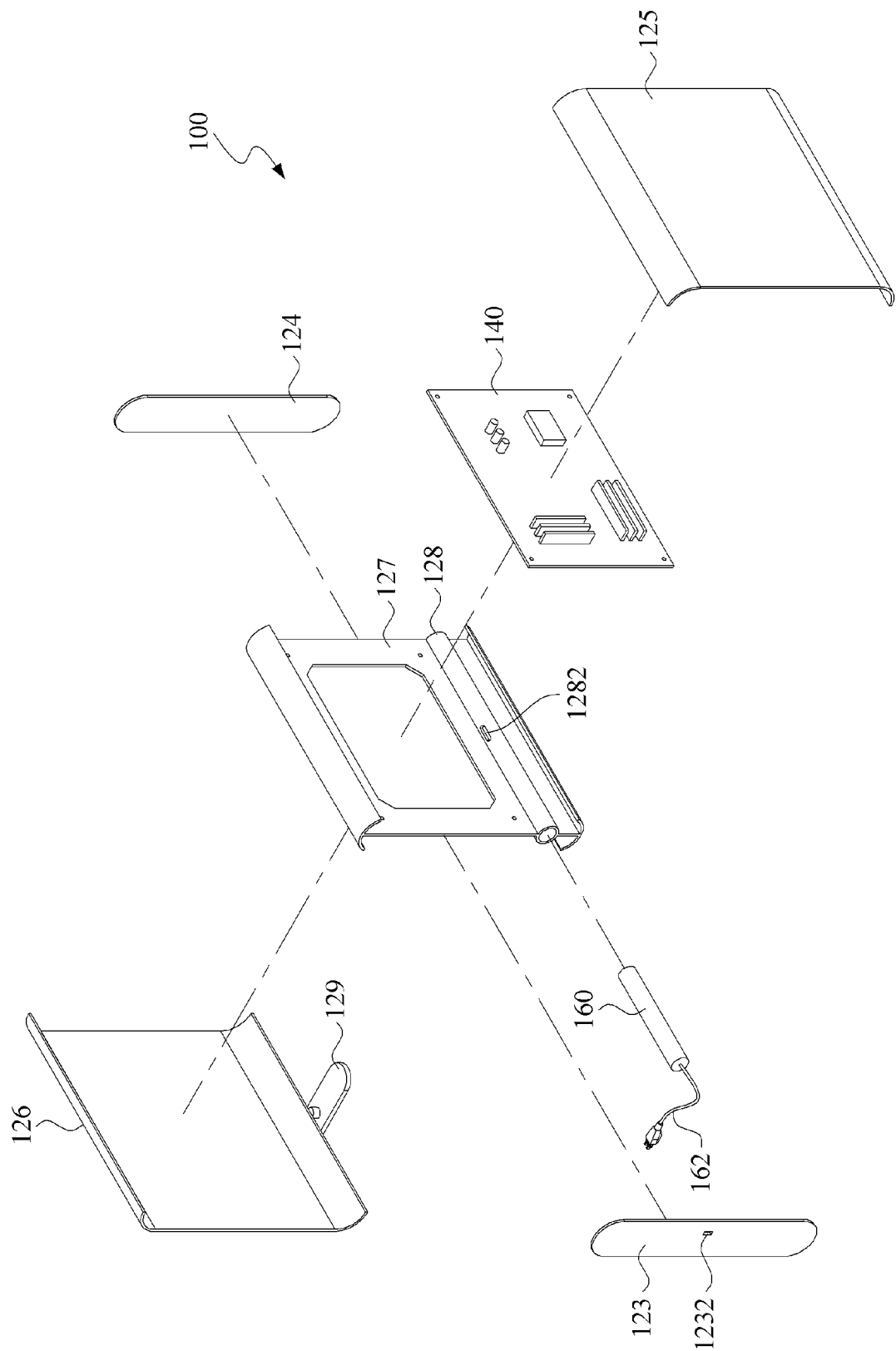
FIG. 4B is a schematic exploded view of the host module in FIG. 3.

FIG. 3 is a schematic three-dimensional diagram of a first embodiment of a host module 100 according to the disclosure. FIG. 4A is a schematic three-dimensional diagram of the host module 100 in FIG. 3 with a first side plate 123 removed. FIG. 4B is a schematic exploded view of the host module 100 in FIG. 3.

Referring to FIG. 3, FIG. 4A, and FIG. 4B together, the host module 100 of this embodiment includes a case 120, a motherboard 140, and a power supply unit 160.

The case 120 includes a first side plate 123, a second side plate 124, a front panel 125, and a rear panel 126. The second side plate 124 faces the first side plate 123. The front panel 125 is located on a side of the case 120 facing a user, and is usually a side on which a screen (not shown in the figure) is mounted.

Two sides of the front panel 125 are respectively adjacent to the first side plate 123 and the second side plate 124. The rear panel 126 is located on an opposite side of the front panel 125. The first side plate 123, the second side plate 124, the front panel 125, and the rear panel 126 enclose an internal space A0. The case 120 presents a flat shape, to help to be used as the partition structure.

The case 120 includes a motherboard carrier 127 and a separation structure 128 (in an embodiment, a separator) inside. The separation structure 128 is located in the internal space A0, extends from the first side plate 123 to the second side plate 124, and substantially divides the internal space A0 of the case 120 into a first part A1 and a second part A2 along a vertical direction.

In an embodiment, the first part A1 has a larger space, and is used for accommodating the motherboard 140. The second part A2 has a smaller space, and is used for accommodating the power supply unit 160. Both the first part A1 and the second part A2 extend from the first side plate 123 to the second side plate 124.

In an embodiment, the motherboard carrier 127 is vertically disposed in the first part A1, and used for carrying the motherboard 140. The second part A2 is substantially located under the first part A1, and presents a cylindrical space for disposition the power supply unit 160. In an embodiment, as shown in the figures, the motherboard carrier 127 and the separation structure 128 are integrated into a single structure.

In an embodiment, the separation structure 128 between the second part A2 and the first part A1 further includes a hole 1282. The power supply unit 160 is electrically connected to the motherboard 140 through the hole 1282, to provide electrical energy required by operation of the motherboard 140. In addition, the power supply unit 160 is connected to the mains through a power supply line 162 to obtain electrical energy. The power supply line 162 extends outward through a lower edge of the case 120.

In this embodiment, the second part A2 is presented as a cylindrical space, but is not limited thereto. According to different separation designs, the second part A2 is also presented as a half-cylindrical space, a triangular tubular space, a quadrilateral tubular space, and the like.

In an embodiment, in addition to accommodating the power supply unit 160, an interior of the second part A2 also accommodates a power supply line or other wires according to actual needs, to prevent the line or wires from being exposed outside, thereby making the office space more concise.

In an embodiment, the first side plate 123 of the case 120 includes a connection port 1232. The connection port 1232 is electrically connected to the motherboard 140, and is used for connecting the expansion module 14 shown in in FIG. 1 and FIG. 2 to expand functions of the host module 100.

Based on the above embodiments, the connection port 1232 is a universal serial bus (USB) connection port, a video output port, an audio output/input port, and the like. A USB connection port is used as an example in the figures.

In an embodiment, the connection port 1232 is a connection port having a power supply function. In other embodiments, the connection port 1232 is also a connection port only having a signal transmission function. In an embodiment, the second side plate 124 also includes a connection port, to provide more expansion options.

The motherboard 140 is disposed on one side of the motherboard carrier 127 of the host module 100 of this embodiment, but is not limited thereto. In other embodiments, the host module 100 includes two motherboards 140 inside, and the two motherboards 140 are respectively disposed on two sides of the motherboard carrier 127. The two motherboards 140 is powered by the same power supply unit 160. In this way, the host module 100 is used by two users at the same time.

In an embodiment, the host module 100 includes a stand 129. The stand 129 is disposed under the case 120, so that the host module 100 is firmly mounted on a desktop of a desk. The stand 129 is removably mounted on a lower edge of the case 120 in a mechanical fixing manner such as screw locking and engagement. A user selects different stands according to needs.

Figure 5:
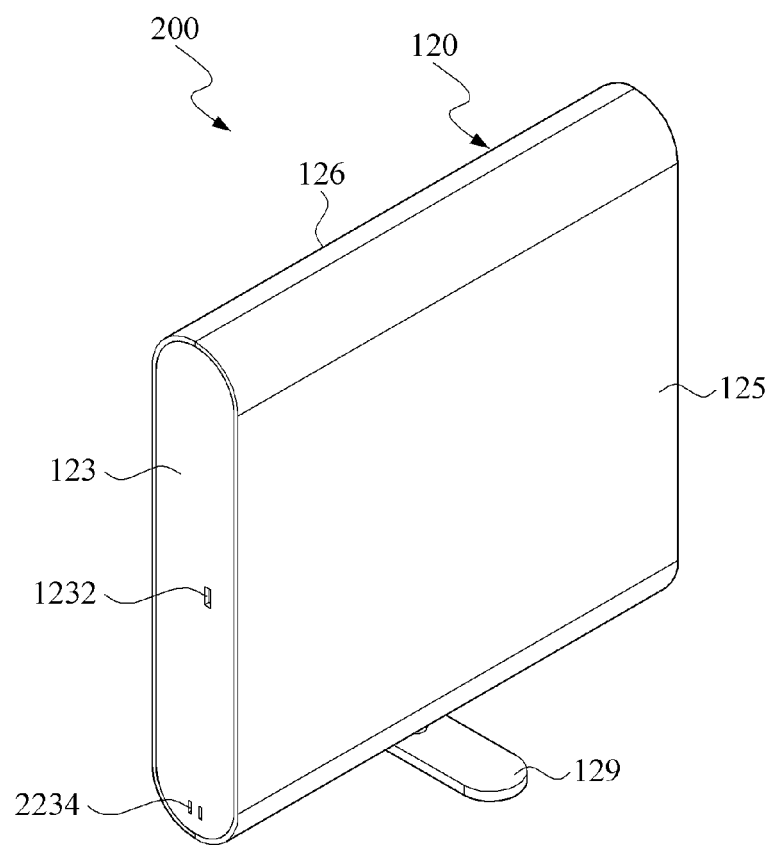
FIG. 5 is a schematic diagram of a second embodiment of a host module according to the disclosure.

FIG. 5 is a schematic diagram of a second embodiment of a host module 200 according to the disclosure. The host module 200 of this embodiment mainly differs from the host module 100 in FIG. 3 in that, in addition to a connection port 1232, a first side plate 123 of a case 120 of this embodiment further includes a power supply socket 2234.

In an embodiment, the connection port 1232 is located at a position on the first side plate 123 corresponding to a motherboard (not shown in the figure) inside the case 120, and the power supply socket 2234 is located at a position on the first side plate 123 corresponding to a power supply unit (not shown in the figure) inside the case 120. The power supply socket 2234 is electrically connected to the power supply unit, obtains electric energy from the power supply unit, and then supplies the electric energy to the outside.

When a power supply connector corresponding to the power supply socket 2234 is disposed on an expansion module 14 or another host module 12, the power supply connector is plugged into the power supply socket 2234 to obtain power. In an embodiment, the power supply socket 2234 is an alternating current socket, but is not limited thereto. In an embodiment, the power supply socket is alternatively a direct current socket. In an embodiment, the power supply socket is further disposed on a second side plate (not shown in the figure) located on an opposite side of the first side plate 123, to provide more connection options.

The host module 200 of this embodiment includes the connection port 1232 and the power supply socket 2234, to meet installation needs of different expansion modules 14. In an embodiment, some expansion modules 14 (in an embodiment, an illumination module) only need to be connected to the power supply socket 2234 to obtain power without being connected to the connection port 1232. Some expansion modules 14 (in an embodiment, a storage module) only need to be connected to the connection port 1232 and obtain power from the connection port 1232 without being connected to the power supply socket 2234.

Figure 6:
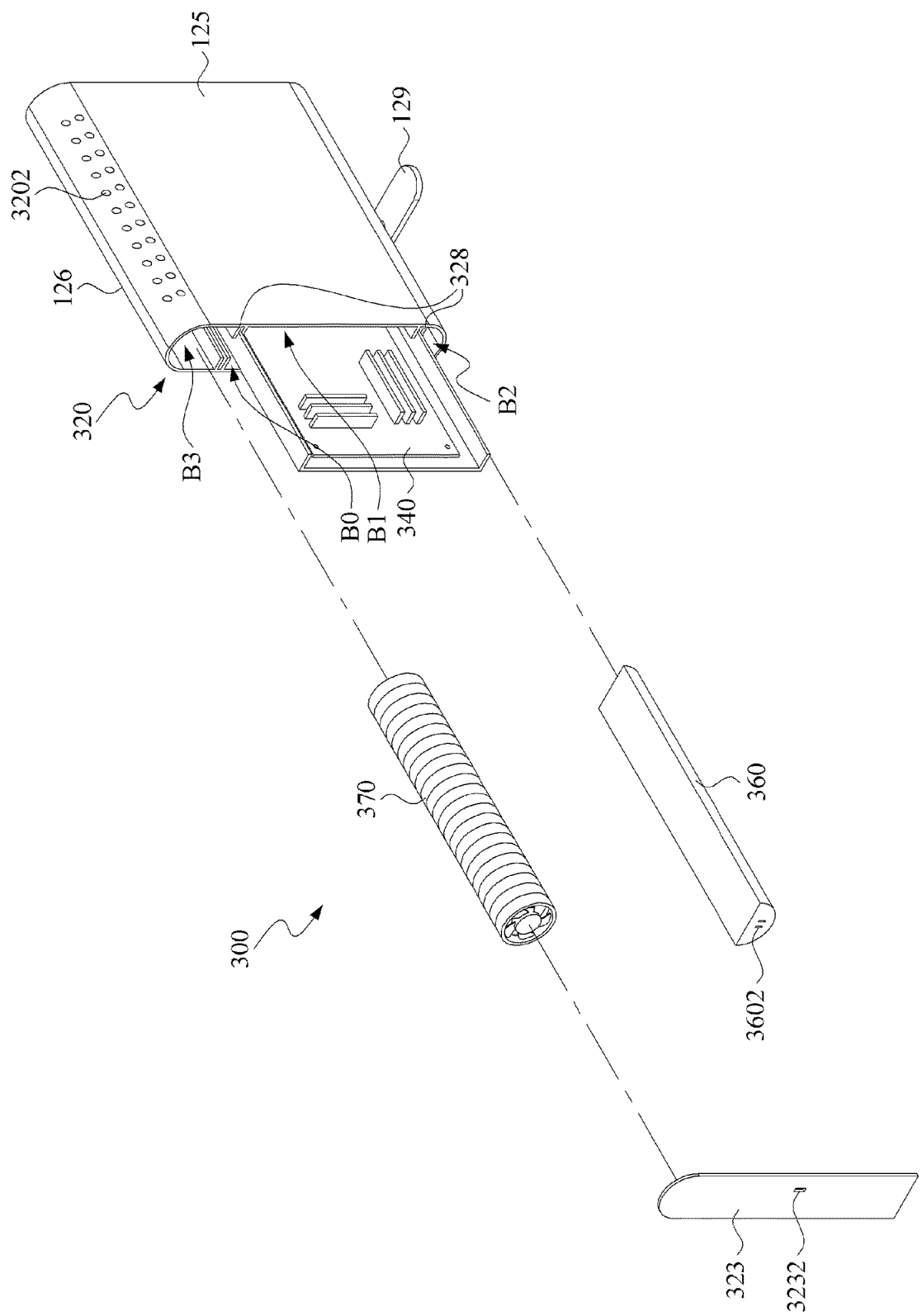
FIG. 6 is a schematic diagram of a third embodiment of a host module according to the disclosure.

FIG. 6 is a schematic diagram of a third embodiment of a host module 300 according to the disclosure. The host module 300 of this embodiment mainly differs from the host module 100 in FIG. 4A in respect of a division manner of an internal space B0 of a case 320, and a power supply unit 360.

Compared with dividing the internal space A0 of the case 120 into the first part A1 and the second part A2 by the separation structure 128 in the embodiment in FIG. 4A, in this embodiment, a separation structure 328 is used to divide the internal space B0 of the case 320 into a first part B1, a second part B2, and a third part B3 along a vertical direction.

In an embodiment, the first part B1 is located in the middle of the case 320 and used for accommodating a motherboard 340. The second part B2 is located under the first part B1 and used for accommodating the power supply unit 360. The third part B3 is located above the first part B1 as a heat dissipation space. Both the second part B2 and the third part B3 are in communication with the first part B1.

The third part B3 extends from a first side plate 323 to a second side plate (not shown in the figure) located on an opposite side of the first side plate 323, to form a heat dissipation air duct. The first side plate 323 includes a connection port 3232.

In an embodiment, a plurality of heat dissipation holes 3202 is provided on an upper edge of a shell of the case 320, that is, at a position corresponding to the third part B3. In an embodiment, as shown in the figure, the host module 300 is also provided with a heat dissipation fan module 370 disposed in the third part B3, to improve heat dissipation efficiency.

Compared with the power supply unit 160 having a function of supplying power to the motherboard 140 in the embodiment of FIG. 4A, in this embodiment, in addition to supplying power to the motherboard 340, the power supply unit 360 further includes a power supply socket 3602 to provide a function of power transmission.

As shown in FIG. 6, the power supply unit 360 is elongated, and a shape thereof substantially corresponds to a shape of the second part B2. An end surface of the power supply unit 360 includes a power supply socket 3602 used for supplying power to the outside. When the power supply unit 360 is disposed in the second part B2, the end surface of the power supply unit 360 extends to the first side plate 323, to expose the power supply socket 3602 to the outside.

Figure 7:
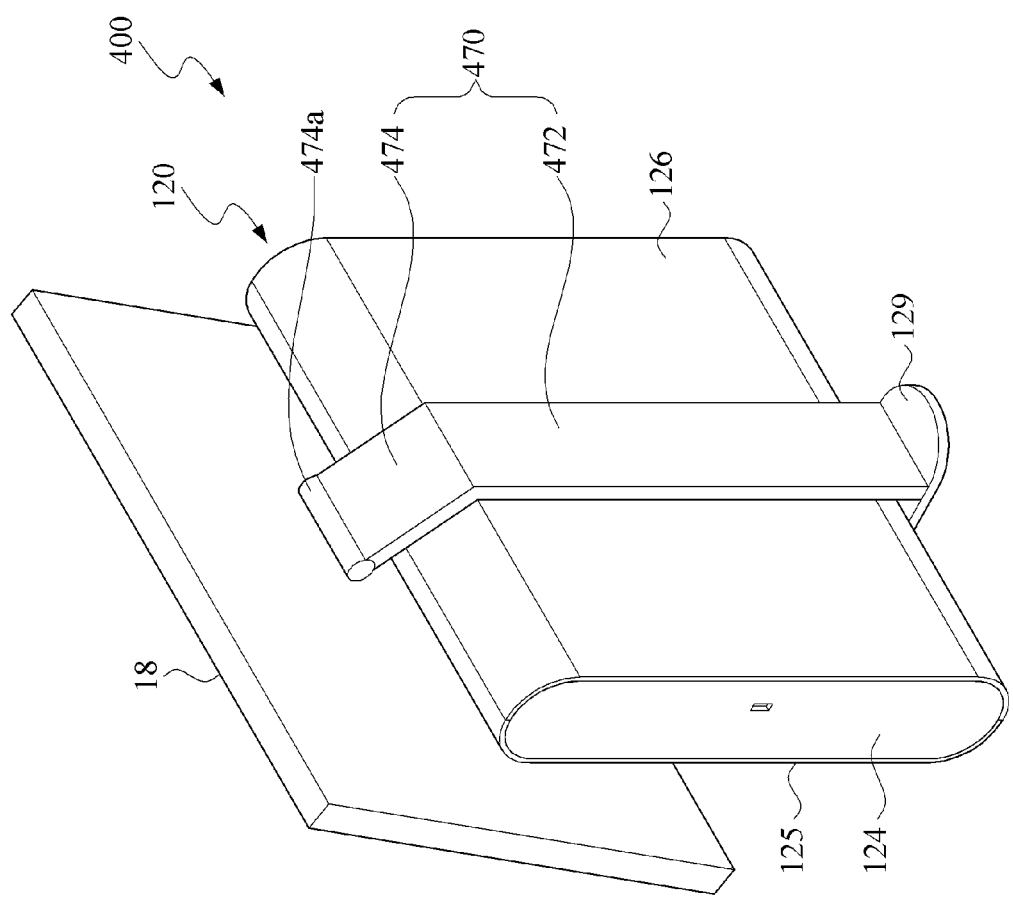
FIG. 7 is a schematic diagram of a fourth embodiment of a host module according to the disclosure.

FIG. 7 is a schematic diagram of a fourth embodiment of a host module 400 according to the disclosure. As shown in the figure, compared with the host module 100 in FIG. 3, the host module 400 of this embodiment includes a screen support 470, and the screen support 470 includes a lower part 472 and an upper part 474.

The lower part 472 extends, along a rear panel 126 of a case 120, upward from a position of a stand 129 to an upper edge of the case 120, and the upper part 474 extends from the upper edge of the case 120 toward a user.

A screen 18 is fixed on a tail end 474a of the upper part 474. In this way, the screen 18 is disposed in front of a front panel 125 of the case 120. The screen 18 is electrically connected to a motherboard 140 in the case 120 through the screen support 470, to obtain display signals, and is electrically connected to a power supply unit 160 in the case 120 through the screen support 470, to obtain power.

Through the screen support 470, the screen 18 is disposed as close to the front panel 125 of the case 120 as possible, which helps to increase a distance between the user and the screen 18, thereby resolving a problem of an insufficient depth of a desk.

A centralized configuration manner provided by the host modules 100, 200, 300, and 400 disclosed in the disclosure achieves thinning of modules, and together with the expansion module 14 and the partition module 16, the host modules are further used as partitions of an office. This avoids occupying a desktop area of a desk, and also helps to improve appearance of the office. Furthermore, the expansion module 14 provides a user with various expansion options.

The above are merely preferred embodiments of the disclosure, and do not constitute any limitation on the disclosure. The disclosure can be implemented in any suitable form. Any form of equivalent replacements or modifications to the technical means and technical content disclosed in the disclosure made by a person skilled in the art without departing from the scope of the technical means of the disclosure still fall within the content of the technical means of the disclosure and the protection scope of the disclosure.

What is claimed is:

1. A host module, comprising:
   a case, comprising:
      a first side plate;
      a second side plate, facing the first side plate;
      a front panel, comprising two sides respectively adjacent to the first side plate and the second side plate;
      a rear panel, located on an opposite side of the front panel, wherein the first side plate, the second side plate, the front panel, and the rear panel enclose an internal space; and
      a separation structure, located in the internal space, extending from the first side plate to the second side plate, and dividing the internal space into a first part, a second part, and a third part along a vertical direction, wherein the second part is located under the first part, and the third part is located above the first part as a heat dissipation space;
   a motherboard, disposed in the first part; and
   a power supply unit, disposed in the second part, and electrically connected to the motherboard.

2. The host module according to claim 1, wherein the first side plate comprises a connection port electrically connected to the motherboard.

3. The host module according to claim 1, further comprising a stand, fixed under the case.

4. The host module according to claim 1, wherein the separation structure comprises a hole, and the power supply unit is electrically connected to the motherboard through the hole.

5. The host module according to claim 1, wherein the first side plate comprises a power supply socket electrically connected to the power supply unit.

6. The host module according to claim 1, wherein an end surface of the power supply unit extends to the first side plate, and the end surface comprises a power supply socket.

7. The host module according to claim 1, wherein the third part extends from the first side plate to the second side plate.

8. The host module according to claim 1, further comprising a heat dissipation fan module, disposed in the third part.

9. The host module according to claim 1, wherein a plurality of heat dissipation holes is provided on a shell of the case corresponding to the third part.

10. A computer device, comprising:
a host module, comprising:
 a case, comprising:
  a first side plate;
  a second side plate, facing the first side plate;
  a front panel, comprising two sides respectively adjacent to the first side plate and the second side plate;
  a rear panel, located on an opposite side of the front panel, wherein the first side plate, the second side plate, the front panel, and the rear panel enclose an internal space; and
  a separation structure, located in the internal space, extending from the first side plate to the second side plate, and dividing the internal space of the case into a first part, a second part, and a third part along a vertical direction, wherein the second part is located under the first part, and the third part is located above the first part as a heat dissipation space;
 a motherboard, disposed in the first part; and
 a power supply unit, disposed in the second part, and electrically connected to the motherboard, wherein the first side plate comprises a connection port electrically connected to the motherboard; and
an expansion module, disposed on a side of the host module, and electrically connected to the connection port.

11. The computer device according to claim 10, further comprising a screen, disposed on the front panel of the case.

* * * * *